Jan. 23, 1962 J. E. LINDSAY ETAL 3,018,391

SEMICONDUCTOR SIGNAL CONVERTER APPARATUS

Filed April 29, 1959

INVENTORS
JAMES E. LINDSAY
& THOMAS B. MARTIN
Milton S. Winters
ATTORNEY 3,018,391
Patented Jan. 23, 1962

3,018,391

SEMICONDUCTOR SIGNAL CONVERTER APPARATUS

James E. Lindsay, Williamsville, N.Y., and Thomas B. Martin, Collingswood, N.J., assignors to Radio Corporation of America, a corporation of Delaware Filed Apr. 29, 1959, Ser. No. 809,868
6 Claims. (Cl. 307—88.5)

This invention relates generally to modulated carrier type amplifiers, and more particularly to high speed semiconductor choppers for use therein.

A major obstacle in the application of direct current (D.C.) amplifiers is their inherent D.C. offset and drift. This difficulty has been overcome for the case of narrow band amplifiers by using a mechanical chopper to change the input signal into a modulated alternating current (A.C.) voltage, amplifying the resultant with an A.C. coupled amplifier, and rectifying the output of the A.C. amplifier. This rectification may also be accomplished by chopper action. The available bandwidth of such a system, commonly referred to as a modulated carrier type amplifier, is a function of the operating frequency of the chopper.

As described at page 202 of the book, "Electronic Analog Computers," by Korn and Korn, McGraw-Hill Book Company, 1952, the range of signal frequencies usable with modulated carrier type amplifiers is restricted to frequencies lower than the carrier, or chopper, frequency by about a factor of 10. It has generally not been possible to employ modulated carrier type amplifiers using mechanical vibrators directly in high gain amplifiers for computer applications because most mechanical vibrators cannot be operated consistently at frequencies much higher than 400 cycles per second (c.p.s.). It is desirable, therefore, to provide a high speed chopper whereby the useable signal frequency range of such an amplifier may be extended.

Modulated carrier type amplifiers have been combined with conventional D.C. amplifiers in such a manner that the freedom from drift of the former and the superior high-frequency response of the latter are both realized. However, when a chopper of low frequency, such as 400 c.p.s., is used in such a system, the components of the circuit used to filter out the carrier frequency are generally physically large and expensive, and may be unduly multiplied.

It has been suggested that semiconductor devices be used to provide chopper action. Semiconductors are compact in size, have low power requirements, and have no moving parts to wear out or limit operating speed. The application of semiconductors as choppers depends on the extent to which chopper errors can be minimized for extremes of environment. Of these, drift produced by temperature change is the most troublesome. Most known semiconductor choppers include at least a pair of closely matched transistors connected in a balanced network, and further include special circuitry to compensate for changes in the transistor characteristics due to changes in temperature.

It has been found that a chopper comprising a unipolar "field-effect" transistor permits wideband carrier operation in a simple and direct manner. Unipolar transistors are described, in general, in an article by G. C. Dacey and I. M. Ross, entitled, "Unipolar 'Field-Effect' Transistor" in the Proceedings of the IRE, vol. 41. pages 970–979, August 1953, and in other publications. As described in the aforesaid publication, a unipolar transistor can be regarded, in essence, as a structure containing a conducting current path, the conductivity of which is modulated by the application of a transverse electric field. The unipolar transistor has the distinct advantage as a chopper that it does not have to be energized to provide the closed condition. Because the device is a passive element in the closed condition, temperature variations are minimized. Also, the impedance presented in the open condition may be made extremely high, of the order of tens of megohms, so that the effects of changes in temperature are minimized.

It is a primary objective of the present invention to provide a high speed chopper.

It is another object of the present invention to provide a chopper that does not employ any moving mechanical parts and that overcomes the limitations of mechanical choppers.

It is still another object of the present invention to provide a novel semiconductor chopper which has a reduced number of components, does not require a pair of closely matched transistors, and operates stably over a wide range of temperatures.

Yet another object of this invention is to provide a novel semiconductor chopper that may be used to generate a high frequency carrier for a modulated carrier type amplifier, and the like.

A further object of the present invention is to provide a chopper having the above advantages and comprising a unipolar transistor.

These and other objects are accomplished by conencitng a unipolar, or "field-effect," transistor in shunt with the signal translating path carrying the signal to be converted. One of the source and drain electrodes is connected to the signal translating path, and the other is connected to a point of refeernce potential. Signals at the chopper frequency are applied across the rectifying junction of the unipolar device to vary the space charge region, and thereby to vary the impedance between the source and drain electrodes. The chopper signal may be a square wave, and is preferably of such magnitude and polarity as to vary the bias across the junction from zero volts to a reverse bias equal to, or greater than, the "pinch-off" voltage.

The foregoing and other objects, advantages, and novel features of the invention will be more fully apparent from the following description when read in connection with the accompanying drawing, in which like reference numerals refer to like parts, and in which.

Figure 1:
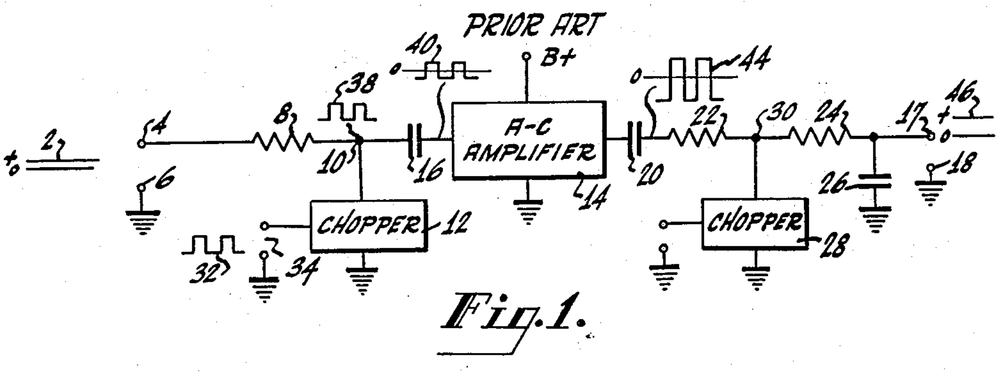
FIGURE 1 is a schematic diagram of a known modulated carrier type amplifier in which a first chopper is used for chopping an input signal into an A.C. signal, and a second chopper is used for rectifying the amplified A.C. signal.

In FIGURE 1 there is illustrated a modulated carrier type amplifier suitable for practicing the present invention. Such an amplifier can amplify voltages or signals within a range from zero frequency up to an upper frequency limit of about one-tenth the carrier frequency, or operating frequency of the chopper. For purposes of illustration, assume that it is desired to amplify a D.C. voltage 2, such as an error or offset voltage. The D.C. input voltage 2 is applied across a pair of input terminals 4, 6. One input terminal 6 is connected to a reference potential, in this case circuit ground. The other terminal 4 is operatively connected through a resistor 8 to a junction 10 on the input signal translating path. A chopper 12 is connected between the junction 10 and reference ground.

The junction 10 is also connected to the input of an A.C. amplifier 14 through a coupling capacitor 16. The output of the A.C. amplifier is connected to one output terminal 17 of a pair through the series combination of a capacitor 20 and resistors 22, 24. The other output terminal 18 of the pair is grounded. A capacitor 26 is connected between the one output terminal 17 and ground. A second chopper 28 is connected between ground and the junction 30 between the series resistors 22, 24. The amplifier 14 is supplied with a suitable operating potential, as indicated by the terminal B+ and the connection to reference ground.

The chopper 12 (and 28) is essentially a shunt switch connected between ground and the junction 10 on the signal translating path. Drive signals 32 are applied across the input terminals 34 of the chopper 12 to selectively open and close the switch. Closing the switch applies ground potential to the junction 10. The chopper 12, in effect, alternately couples and decouples the input terminal 4 and the A.C. amplifier 14, and converts the D.C. input voltage 2 into an A.C. signal 38. The amplitude of the A.C. signal 38 is proportional to the amplitude of the input signal 2. The input capacitor 16 shifts the zero reference of the chopped signal to provide the A.C. signal 40 at the amplifier 14 input. When the input applied across the input terminals 4, 6 is a non-zero frequency signal, chopper 12 action converts this input to a modulated carrier wave at the frequency of the chopper 12 driving signal 32.

The A.C. signal 40 is then amplified by the amplifier 14. The amplified replica 44 of the signal 40 is rectified by the second chopper 28 to restore the previous reference level. The second chopper 28 may be the same type as the first chopper 12. Assuming that the amplifier 14 output has the same polarity as the input thereto, the chopper 28 may be operated by the drive signal 32. The rectified signal is filtered by the network comprising the resistor 24 and capacitor 26. The output 46 appearing across the output terminals 14, 18 (and the capacitor 26) is an amplified replica of the input signal 2.

As discussed previously, the range of input signal frequencies that may be amplified satisfactorily in such a system is limited to frequencies lower than the carrier, or chopper frequency, by about a factor of 10. Assuming that the choppers 12 and 28 have a maximum operating frequency of 400 c.p.s., the maximum frequency of the input signal is then about 40 c.p.s. The components necessary to filter the carrier frequency from the output are generally large and expensive at this frequency and, additionally, several filter sections may be required.

Figure 2:
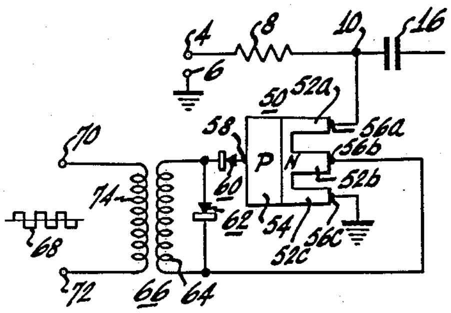
FIGURE 2 is an embodiment of a preferred semiconductor chopper according to the present invention.

There is illustrated in FIGURE 2 an embodiment of a preferred semiconductor chopper comprising a unipolar transistor according to the present invention. A portion of the signal translating path of the FIGURE 1 amplifier is included to illustrate a suitable operating environment for the chopper. The unipolar transistor 50 essentially comprises three n-type zones 52*a*, 52*b*, 52*c* contiguous with a zone 54 of p-type semiconductor material. The semiconductor material may be, for example, silicon. Ohmic connections 56*a* and 56*b* are made to the zones 52*a* and 52*b* and serve as drain and source electrodes, respectively. The drain 56*a* is connected directly to the input signal translating path at the junction 10 between the input resistor 8 and coupling capacitor 16. The source 56*c* may be connected directly to ground.

An ohmic contact 58 is made to the p-type zone 54 and serves as a gate, or control. The gate 58 is connected by way of a diode 60 and the parallel combination of a second diode 62 and the secondary winding 64 of a transformer 66 to the ohmic contact 56*b* of the center n-type zone 52*b*. Driving signals 68 are applied across the terminals 70, 72 of the transformer 66 primary winding 74. Although the driving signal 68 is illustrated as a square wave, a sine wave driving signal also may be used. The diode 62 is poled to provide a very low impedance path across the secondary winding 64 for that portion of the driving signal 68 tending to bias the gate 58 in a positive direction relative to the ohmic contact 56*b*. The diode 60 is poled in a direction ot provide a low impedance path for driving signals 68 of a polarity to reverse bias the p-n junction. Effectively, the diodes 60, 62 allow the bias across the p-n junction to vary from approximately zero volts to some value of reverse bias determined by the amplitude of the driving signal 68.

As is known, conduction between source and drain in a unipolar transistor is by way of majority carriers. There exists in the vicinity of the p-n junction a space charge region which extends into the n-type region an amount determined by the reverse bias across the junction. For the unipolar transistor illustrated in FIGURE 2, the reverse bias is the voltage difference appearing between the ohmic contact 56*b* and the gate 58, and is determined by the amplitude of the driving signal 68. The resistance between the source and drain 56*c* and 56*a* increases as the depth of space charge penetration increases. If the reverse bias is made high enough, the space charge region becomes thick enough to "pinch-off" the conducting channel between the source 56*c* and the drain 56*a*, and the resistance therebetween may attain a value of the order of tens of megohms. In one particular embodiment, the resistance was measured and found to be of the order of 100 megohms for a "pinch-off" voltage of approximately 10 volts.

The unipolar transistor is inherently a high frequency device because conduction is by majority carriers. As a chopper device, the unipolar transistor has the further advantage that no bias voltage is required in the closed condition. Because the unipolar transistor is a passive device in the closed condition, heating of the transistor is minimized. Drive signals are applied to provide the open circuit condition. Because of the very high open circuit resistance, the effects on the transistor characteristics, especially open circuit resistance, due to temperature changes are reduced. Drain current in the "pinch-off" condition is that due only to leakage of the gate diode. However, the effect of this leakage current is minimized, if not completely cancelled, by current flowing between the gate 58 and the source 56*c* because of the balanced configuration.

Figure 3:
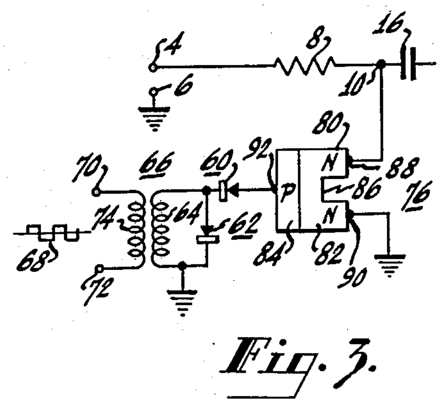
FIGURES 3 and 4 are alternative embodiments of semiconductor choppers according to the present invention.

Another embodiment of the present invention is illustrated in FIGURE 3. Components which are generally the same as those illustrated in FIGURE 2 are designated by similar reference numerals. The unipolar transistor 76 comprises first and second zones 80 and 82 of one conductivity type semiconductor material, such as silicon. Contiguous therewith is a zone 84 of the opposite conductivity type semiconductor material, illustrated as n-type.

The device may be manufactured, for example, by cutting a slot 86 in the n-type region of a semiconductor having a p-n junction. The reverse bias required for "pinch-off" is a function of the depth of the slot 86. More precisely, the reverse bias required for "pinch-off" of the channel between the source 90 and drain 88 is a function of the channel width between the p-type zone 84 and the bottom of the slot 86.

The reverse bias for the p-n junction is provided by the driving signal 68. Diodes 60 and 62 are poled so that the voltage at the ohmic gate 92 alternates between approximately zero volts and some negative value. The latter value is determined by the amplitude of the drive signal 68, and preferably reaches the "pinch-off" voltage so as to produce maximum resistance between the source 90 and drain 88 in the open condition. The drain 88 is connected directly to the junction 10 on the signal translating path. The source 90 and the lower terminal of the secondary winding 64 are grounded to provide a complete path for the bias circuit.

Operation of this semiconductor chopper is similar to that of the chopper illustrated in FIGURE 2 and described previously. Although these two choppers have been illustrated as suitable high frequency devices for replacing the chopper 12 of FIGURE 1, it is to be understood that their use is not limited thereto: for example, they may also replace the second chopper 28 of FIGURE 1, in which case they would function as rectifiers for the amplified A.C. signal 44. To illustrate the latter use, another embodiment of a semiconductor chopper according to the present invention is shown in FIGURE 4 connected in the output circuit of the previously described modulated carrier type amplifier.

Figure 4:
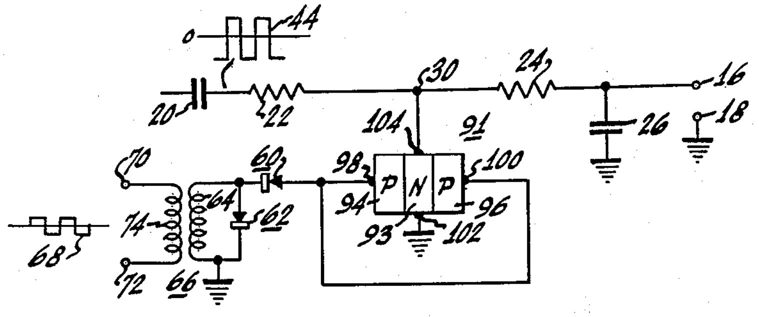

The unipolar transistor 91 of FIGURE 4 comprises a body 92, or zone, of n-type material sandwiched between two bodies 94 and 96 of p-type material. Here again the material may be silicon. Two p-n rectifying junctions are provided by this arrangement. The bodies 94 and 96 of p-type material have connected thereto ohmic contacts 98, 100, respectively, which serve as gates and which are connected together externally by negligible ohmic impedance means. Ohmic contacts 102, 104 are connected to the n-type region 92 near opposite ends of the rectifying junctions and serve as source and drain, respectively. The source 102 is connected directly to reference ground, and the drain 104 is connected to the junction 30 between resistors 22 and 24.

The gates 98, 100 are connected by way of diode 60 and the parallel combination of diode 62 and secondary winding 64 to ground. Driving signals 68 are applied across the primary winding 74 of the transformer 66. As in the two previously described embodiments, diodes 60 and 62 function to vary alternately the voltage at the gates 98 and 100 between approximately zero volts and some negative voltage in response to the driving signals 68. Operation of the chopper is so synchronized with the A.C. signal 44 as to rectify either the positive or negative portions of the A.C. signal 44 and restore the zero reference level to its desired location.

The conducting channels of each of the unipolar transistors 50, 76 and 91 have been illustrated as comprising n-type material. In like manner, each of the gates 58, 92, 98 and 100 have been illustrated as an ohmic contact to p-type material. In accordance with known transistor theory, the n and p-type conductivity materials may be interchanged provided that the polarities of the diodes 60 and 62 are reversed accordingly. The three embodiments illustrated and described here are meant to typify the use of a unipolar transistor as a chopper and to present the presently preferred embodiments thereof.

What is claimed is:

1. In combination with a signal translating path, a pair of input terminals, a pair of output terminals, and a point of reference potential connected to one of said input terminals and to one of said output terminals, said path being connected between the others of said input and said output terminals: a shunt switch comprising a first semiconductor body of one conductivity type material, a second semiconductor body of opposite conductivity type contiguous with said first body and forming a rectifying junction therebetween, a pair of ohmic contacts affixed to said first body near opposite ends of said rectifying junction, one of said pair of contacts being connected to said reference point, the other of said pair of contacts being connected to said signal translating path at a point between said others of said input and said output terminals, a third ohmic contact affixed to said second body, means operatively connected with said third ohmic contact for alternately varying the reverse bias across said rectifying junction between a first limit of zero volts and a second limit close to the "pinch-off" voltage of said first body, and a unidirectional conducting means connected externally between said third ohmic contact and said one of said pair of contacts to prevent forward biasing of said rectifying junction.

2. The shunt switch set forth in claim 1 wherein said reverse bias varying means effects a periodically varying potential at said third ohmic contact relative to said reference potential.

3. A semiconductor chopper comprising a unipolar transistor having a first region of one conductivity type semiconducting material, a second region of opposite conductivity type semiconducting material contiguous with a portion of said first region and forming a rectifying junction therebetween, a first ohmic contact affixed to said first region, second and third ohmic contacts affixed to said first region on opposite sides of said first ohmic contact and spaced therefrom, a fourth ohmic contact affixed to said second region, means for applying a signal voltage across said second and third ohmic contacts to be chopped, and means including a non-linear impedance element connected with said first and said fourth ohmic contact for selectively alternating the reverse bias across said rectifying junction between a first value of zero volts and a second value close to the "pinch-off" voltage of said first region.

4. The semiconductor chopper set forth in claim 3 wherein said signal voltage is an alternating current voltage of one frequency and said reverse bias is selectively varied at said one frequency.

5. A semiconductor chopper comprising: a first semiconductor body of one conductivity type material; a second semiconductor body of opposite conductivity type contiguous with said first body and forming a rectifying junction therebetween; a pair of spaced ohmic contacts affixed to said first body and defining a conducting channel through said first body; another ohmic contact affixed to said second body; means for applying externally across said pair of contacts a signal voltage to be chopped; means operatively connected with said other contact for alternately varying the voltage at said other contact, with respect to one of said pair, between a first value of zero volts and a second value close to the "pinch-off" voltage of said conducting channel and unidirectional conducting means connected between said one of said pair.

6. A semiconductor chopper comprising a unipolar transistor having a first region of one conductivity type semiconducting material, a second region of opposite conductivity type semiconducting material contiguous with a portion of said first region and forming a rectifying junction therebetween, a first ohmic contact affixed to said first region, second and third ohmic contacts affixed to said first region on opposite sides of said first ohmic contact and spaced therefrom, a fourth ohmic contact affixed to said second region, means for applying a signal voltage across said second and third ohmic contacts to be chopped, means connected with said first ohmic contact and said fourth ohmic contact for selectively alternating the reverse bias across said rectifying junction to vary the impedance between said second and third ohmic contacts, and unilateral conducting means connected externally between said first ohmic contact and said fourth ohmic contact to prevent forward biasing of said rectifying junction.

References Cited in the file of this patent

UNITED STATES PATENTS

| | | |
|---|---|---|
| 2,659,043 | Taylor | Nov. 10, 1953 |
| 2,809,303 | Collins | Oct. 8, 1957 |
| 2,820,154 | Kurshan | Jan. 14, 1958 |
| 2,869,055 | Noyce | Jan. 13, 1959 |
| 2,900,531 | Wallmark | Aug. 18, 1959 |

OTHER REFERENCES

Hunter: Handbook of Semiconductor Electronics, page 16–8, McGraw-Hill, New York (October 15, 1956).

UNITED STATES PATENT OFFICE
CERTIFICATE OF CORRECTION

Patent No. 3,018,391 January 23, 1962

James E. Lindsay et al.

It is hereby certified that error appears in the above numbered patent requiring correction and that the said Letters Patent should read as corrected below.

Column 2, lines 26 and 27, for "connecitng" read -- connecting --; line 31, for "refeernce" read -- reference --; column 6, under the heading "UNITED STATES PATENTS" add:

2,825,822 Huang -------- Mar. 4, 1958

Signed and sealed this 5th day of June 1962.

(SEAL)
Attest:

ERNEST W. SWIDER
Attesting Officer

DAVID L. LADD
Commissioner of Patents